United States Patent

Milanes

[11] 3,879,672

[45] Apr. 22, 1975

[54] DIGITAL AUTOMATIC GAIN CONTROL CIRCUIT

[75] Inventor: Eddy J. Milanes, Oklahoma City, Okla.

[73] Assignee: Honeywell Information Systems, Inc., Waltham, Mass.

[22] Filed: Sept. 4, 1973

[21] Appl. No.: 394,015

[52] U.S. Cl. .................. 330/29; 307/264; 330/129; 328/173

[51] Int. Cl. .......................... H03b 3/02; H03g 3/30

[58] Field of Search ............. 330/135, 29, 30 D, 96, 330/129, 130; 328/171, 173, 175; 325/325, 326, 400, 417; 340/15.5 GC, 15.5 DP; 307/264

[56] References Cited

UNITED STATES PATENTS

| | | | |
|---|---|---|---|
| 3,206,689 | 9/1965 | Santana | 328/173 |
| 3,339,018 | 8/1967 | Brown | 328/173 X |
| 3,684,968 | 8/1972 | Carroll | 330/135 X |
| 3,758,868 | 9/1973 | Brown | 328/175 X |
| 3,764,923 | 10/1973 | Woodworth et al. | 328/175 |
| 3,783,385 | 1/1974 | Dunn et al. | 325/326 X |

*Primary Examiner*—Thomas J. Sloyan
*Attorney, Agent, or Firm*—Lloyd B. Guernsey

[57] ABSTRACT

A plurality of threshold detectors, flip-flops and a pulse-to-analog converter develop a voltage which can provide rapid changes in the gain of a variable gain amplifier to keep the level of the output signals from the amplifier nearly constant even when the amplitude of the digital input signals changes suddenly.

6 Claims, 2 Drawing Figures

DIGITAL AUTOMATIC GAIN CONTROL CIRCUIT

BACKGROUND OF THE INVENTION

This invention relates to automatic gain control circuits and more particularly to a digital automatic gain control circuit which provides a voltage which can cause rapid changes in the gain of a variable gain amplifier so that the level of output signals from the amplifier remain nearly constant even when the amplitude of the digital input signals changes suddenly.

In modern data processing systems data characters are stored on magnetic tape or magnetic disks for retrieval and use at a later time. In magnetic tape recording each of the data characters is represented by a combination of binary ones and binary zeros which are stored along the width of the magnetic tape. When the data characters are read from the tape it is found that the amplitude of the binary ones and binary zeros may vary over a wide range. These changes in amplitude may be caused by dirt on the magnetic tape, mechanical tape flutter, wear on the magnetic head, wear of the magnetic tape, or differences in the magnetic oxide which is deposited on the tape. These variations in the signals may cause errors to be introduced into the data being read from the magnetic tape. What is needed is an automatic gain control system to prevent variations in the amplitude of the binary ones and binary zeros being read from the magnetic tape.

Several prior art automatic gain control circuits have been developed which vary the gain of an amplifier to partially correct for the differences in amplitudes of the binary signals being read from the tape. These prior art automatic gain control circuits work fairly well when the signals from the magnetic tape vary in amplitude at a slow rate. However, the circuits are unable to change the gain of the amplifier quickly, so that any sudden decrease in amplitude of the signals being read from the magnetic tape may cause some of the binary signals to be completely lost by the detector circuit in the tape subsystem.

The present invention alleviates some of the disadvantages of the prior art automatic gain control circuits by checking the amplitude of each of the binary signals being read from the magnetic tape and by increasing the gain of an amplifier in the circuit when the amplitude of these binary signals decreases. This rapid change in the gain of the amplifier prevents loss of binary signals being read from the magnetic tape even when the level of the signals suddenly changes.

It is, therefore, an object of this invention to provide a new and improved digital automatic gain control circuit.

Another object of this invention is to provide an automatic gain control circuit having increased speed of response over the prior art circuits.

A further object of this invention is to use digital circuits to provide automatic gain control.

Still another object of this invention is to provide an improved automatic gain control circuit which is useful with a variety of types of signals.

SUMMARY OF THE INVENTION

The foregoing objects are achieved in the instant invention by providing a pulse automatic gain control circuit having a pulse-to-analog converter which provides a voltage which can cause rapid changes in the gain of a variable gain amplifier so that the level of output signals from the amplifier remains nearly constant even when the amplitude of the digital input signals changes suddenly.

Other objects and advantages of this invention will become apparent from the following description when taken in connection with the accompanying drawings.

DESCRIPTION OF THE PREFERRED EMBODIMENT

Figure 1:
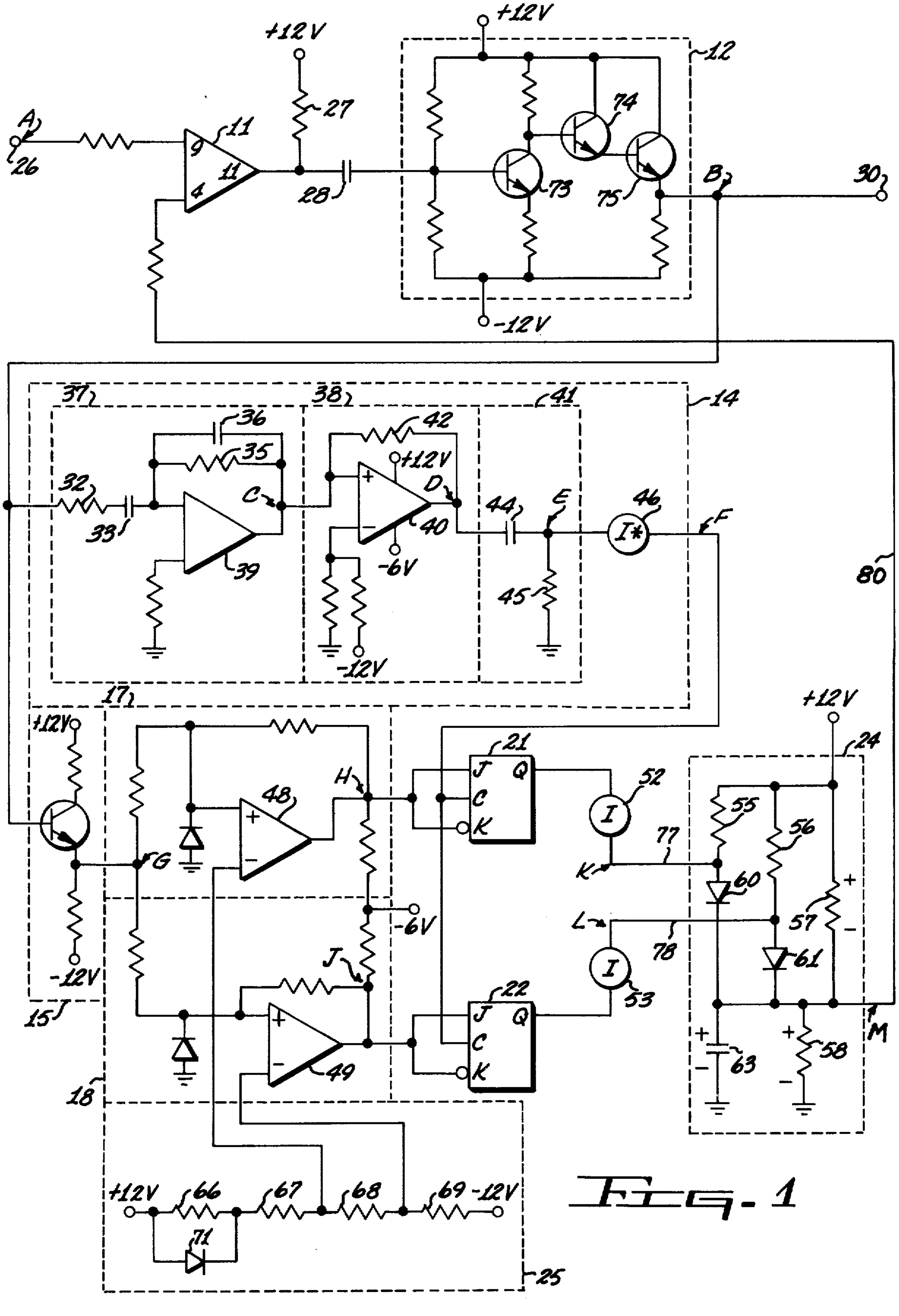
FIG. 1 is a diagram of one embodiment of the instant invention.

The digital automatic gain control circuit of FIG. 1 includes a pair of amplifiers 11 and 12, a peak detector 14, an emitter follower 15, a pair of threshold detectors 17 and 18, and a pulse-to-analog converter which includes a pair of JK flip-flops 21 and 22, inverters 52 and 53 and summing circuit 24. The input signal is applied to the signal input terminal 26 where it is amplified by the variable gain amplifier 11 and by amplifier 12 and applied to the output terminal 30. The variable gain amplifier 11 may be one of several types which are available from several manufacturers. One variable gain magnifier which may be used is the A795 which is a multiplier or a variable gain amplifier. The voltages on input leads 9 and 4 are multiplied to give the output signal on the output lead. The gain of the amplifier 11 is controlled by the amplitude of the voltage on input lead 4. As the voltage on the input lead 4 becomes more positive the gain of amplifier 11 increases. Conversely, as the voltage on the input lead 4 of amplifier 11 becomes less positive the gain of the amplifier decreases. The circuit of the A795 is more fully described in the booklet "Fairchild Linear Integrated Circuits Data Catalog", November 1971, by Fairchild Semiconductor, Mountain View, Calif. Amplifier 12 is a commonly used type of direct-coupled amplifier employing transistors 73, 74 and 75.

The output signal from terminal 30 is coupled to the input leads of the peak detector 14 and to the emitter follower 15. The emitter follower 15 provides isolation between the output terminal 30 and the input leads of the threshold detectors 17 and 18. The detectors 14, 17 and 18 each include a differential voltage comparator having reference numerals 40, 48 and 49 respectively. When the voltage on the positive lead of a comparator is less than the voltage on the negative lead the comparator develops a low value of output voltage on the output lead. When the voltage on the positive lead is greater than the voltage on the negative lead the comparator provides a positive value of voltage at the output lead. A comparator which may be used is the A710 which is available from several manufacturers. Details of the operation of the A710 may be found in the "Fairchild Linear Integrated Circuits Data Catalog", November 1971, by the Fairchild Semiconductor, Mountain View, Calif. The peak detector 14 includes a first differentiator and phase shift circuit 37, a zero crossing detector 38, a second differentiator 41 and an open collector inverter 46. Resistor 32, capacitor 33, resistor 35 and capacitor 36 of differentiator 37 form a filter circuit to reject noise.

The operation of the circuit of FIG. 1 will now be described in connection with the waveforms shown in FIG. 2. The voltage waveform A of FIG. 1 is applied to the input terminal 26 and is amplified by amplifiers 11 and 12 and provided to the output terminal 30 as waveform B. It should be noted that the amplitude of waveform A varies over a wide range while the waveform B has a fairly constant amplitude. The signal of waveform B is applied to the input lead of the peak detector 14 where the phase is shifted approximately 90 degrees by the resistor 35 and capacitor 33 and applied to the upper input lead of amplifier 39. The amplified and phase shifted voltage of waveform C is applied to the positive input lead of the differential voltage comparator or differential amplifier 40. At the time the voltage of waveform C crosses the zero axis the voltage at the output lead of the differential voltage comparator 40 becomes a positive value as shown in waveform D. The voltage of waveform D is differentiated by capacitor 44 and resistor 45 and applied to the input lead of the open collector inverter 46. The open collector inverter 46 eliminates the negative pulses which are developed across resistor 45 and provides negative going trigger pulses to the C input leads of the JK flip-flops 21 and 22 in response to positive going pulses. An inverter provides a logical operation of inversion for an input signal applied thereto. The inverter provides a high positive output signal representing a binary one when the input signal applied thereto has a low value, representing a binary zero. Conversely, the inverter provides an output signal representing a binary zero when the input signal represents a binary one. Such an inverter is shown in FIG. 1 and represented by the reference numerals 52 and 53. The inverter 46 which is marked with an asterisk is an open collector inverter which provides a low output voltage in response to a high input voltage; however, a low value of input voltage causes the open collector inverter to be an open circuit.

The JK flip-flops 21 and 22 are circuits adapted to operate in either one of two stable states and to transfer from the state in which they are operating to the other stable state upon the application of a trigger signal thereto. In one state of operation the JK flip-flop represents a binary one (1-state) and in the other state it represents a binary zero (0-state). The three leads entering the left-hand side of the flip-flop symbol, for example, flip-flop 21, provide the required trigger signals. The upper lead, the J lead, provides the set signal, the lower lead, the K lead, provides the reset signal and the center lead provides the trigger signal. When the set input signal on the J lead is positive, and the reset signal on the K lead is positive, a negative trigger signal on the C lead causes the flip-flop to change to the 1-state, if it is not already in the 1-state. When the reset signal has a low value and the set signal has a low value, a negative trigger signal causes the flip-flop to transfer to the 0-state if it is not already in the 0-state. The Q output lead leaving the right-hand side of the flip-flop delivers a one output signal of the flip-flop.

Figure 2:
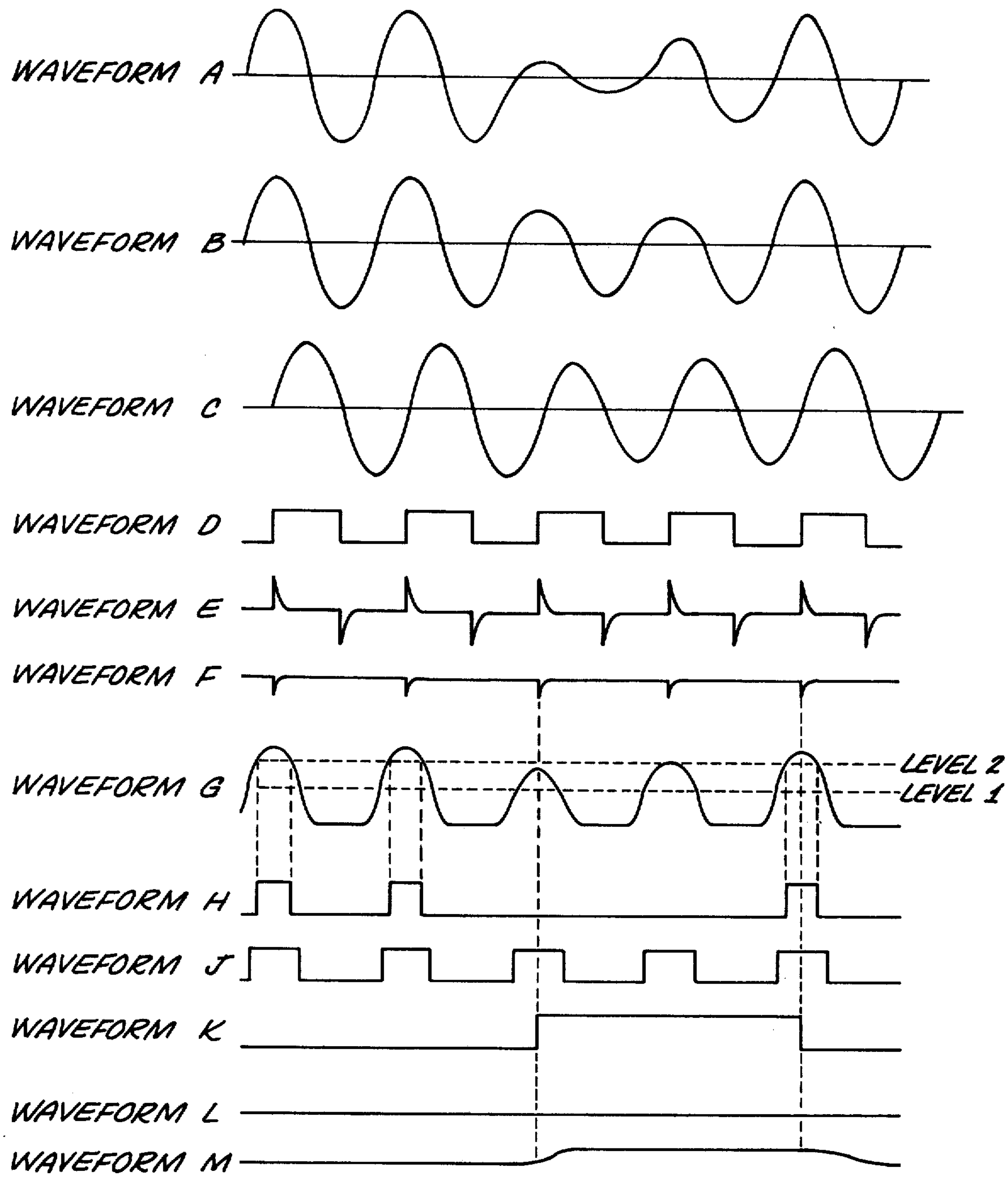
FIG. 2 illustrates waveforms which are useful in explaining the operation of the invention shown in FIG. 1.

The biasing circuit 25 provides a bias voltage to the differential comparators 48 and 49 so that comparator 48 provides a positive value of output voltage when the signal applied to the positive input lead has a level greater than the level 2 shown in waveform G of FIG. 2. The differential voltage comparator 49 is biased so that comparator 49 provides a positive value of output voltage when the input voltage at waveform G is greater than the level 1 shown in waveform G. When the level is less than level 1 neither comparator 48 nor 49 provide a positive value of output voltage.

The operation of the automatic gain control circuit will now be described with three different levels of signals at waveform G. The first signal level discussed will be a signal having an amplitude greater than level 2 at the input leads of comparators 48 and 49. The operation of the automatic gain control circuit will then be discussed using a signal which is between levels 1 and 2 as shown in waveform G. The third amplitude of signal will be a signal having a value less than level 1 shown in waveform G.

When the signal shown in waveform G has a value greater than level 2 comparator 48 provides a positive signal to the J and K input leads of flip-flop 21 at the same time that a negative pulse is applied to the C lead of flip-flop 21 thereby causing flip-flop 21 to be set so that the Q output lead of flip-flop 21 provides a high value of output voltage. The high value of output voltage on the Q output lead of flip-flop 21 is inverted by inverter 52 to provide a low value of input voltage on input lead 77 to the summing circuit 24. This low value of input voltage on input lead 77 causes diode 60 to be back biased so that no current flows through diode 61. At this time the only charge on capacitor 63 is due to a current flowing from the +12 volt source through resistor 57 and 58 to ground. The voltage divider comprising resistors 57 and 58 provides a low value of positive voltage on output lead 80 thereby causing the gain of the variable gain amplifier 11 to be low.

When the input signal to the variable gain amplifier 11 decreases the voltage at the output terminal 30 of amplifier 12 decreases slightly. When this voltage at the output terminal 30 causes the input voltage of waveform G to have a value between level 1 and level 2 the signal on the positive input lead of comparator 48 is low causing comparator 48 to provide a low value of voltage to input leads J and K of flip-flop 21 at the time the negative trigger pulse is applied to the C input lead. This causes flip-flop 21 to be reset so that the voltage on the Q output lead of flip-flop 21 is low. The low value of voltage is inverted by inverter 52 to provide a high value of voltage to input lead 77 of summing circuit 24. This high value of voltage on lead 77 causes diode 60 to conduct and to provide a higher positive value of voltage on output lead 80 of summing circuit 24. This positive voltage on lead 80 causes the gain of amplifier 11 to increase and to increase the amplitude of waveform B.

When the amplitude of waveform G decreases below level 1 the signal on the positive input leads of comparators 48 and 49 is low causing comparators 48 and 49 to provide a low value of voltage to the J and K input leads of flip-flops 21 and 22 at the time that the negative pulse is applied to the C input lead. This causes flip-flops 21 and 22 to be reset so that the voltage on the Q output lead of flip-flops 21 and 22 is relatively low. The low value of voltage on the Q output lead of flip-flops 21 and 22 is inverted by inverters 52 and 53 respectively to provide a high value of positive voltage to input leads 77 and 78 of summing circuit 24. The positive voltages on input leads 77 and 78 cause diode 60 and 61 to be rendered conductive so that a current flows through diode 60 and 61 to provide a higher value of positive voltage across capacitor 62. This higher value of voltage across capacitor 63 provides a higher positive voltage on lead 80 and causes the gain of the variable gain amplifier 11 to be increased so that the signal on the output terminal 30 is almost as large as it was when the input signal on terminal 26 was larger.

When capacitor 63 is made relatively small the voltage across capacitor 63 can be changed at a rapid rate so that even one low value of pulse to the input leads of comparators 48 and 49 causes an increase in the voltage across capacitor 63 and causes a gain of the variable gain amplifier 11 to be increased so that the next pulse is not lost. If it is desired to have a smoother control other comparators and other flip-flops can be added to the circuit shown in FIG. 1. This also requires that more diodes and more resistors be connected between the upper plate of capacitor 63 and the +12 volt terminal of the summing circuit 24.

While the principles of the invention have now been made clear in an illustrative embodiment, there will be many obvious modifications of the structure, proportions, materials and components without departing from those principles. The appended claims are intended to cover any such modifications.

What is claimed is:

1. A digital automatic gain control circuit for use with a source of signals, said circuit comprising:

a variable gain amplifier having first and second input leads and an output lead, the gain of said amplifier being determined by the amplitude of voltage applied to said second input lead, said first input lead of said amplifier being coupled to said source of signals;

a peak detector having an input lead and an output lead, said input lead of said peak detector being coupled to said output lead of said amplifier;

a first threshold detector having an input lead and an output lead, said input lead of said first threshold detector being coupled to said output lead of said amplifier, the amplitude of voltage from said threshold detector being determined by the amplitude of a signal from said amplifier;

a first flip-flop having first, second and third input leads and an output lead, said first and said third input leads of said first flip-flop being connected to said output lead of said first threshold detector, said second input lead of said first flip-flop being connected to said output lead of said peak detector, the voltage from said output lead of said flip-flop being determined by the amplitude of voltage applied to said first and said third input leads of said first flip-flop; and a summing circuit, said summing circuit being connected between said output lead of said first flip-flop and said second input lead of said amplifier, the voltage which said summing circuit provides to said second input lead of said amplifier being determined by the value of voltage from the output lead of said flip-flop.

2. A digital automatic gain control circuit as defined in claim 1 including:

a second threshold detector having an input lead and an output lead, said input lead of said second threshold detector being coupled to said output lead of said amplifier; and a second flip-flop having first, second and third input leads and an output lead, said first and said third input leads of said second flip-flop being connected to said output lead of said second threshold detector, said second input lead of said second flip-flop being connected to said output lead of said peak detector, said output lead of said second flip-flop being coupled to said summing circuit.

3. A digital automatic gains control circuit for use with a source of signals, said circuit comprising:

a variable gain amplifier and first and second input leads and an output lead, said first input lead of said amplifier being coupled to said source of signals the gain of said amplifier being determined by the amplitude of voltage applied to said second input lead;

a phase shift circuit having an input lead and an output lead, said input lead of said phase circuit being coupled to said output lead of said amplifier;

a zero crossing detector having an input lead and an output lead, said input lead of said zero crossing detector being connected to said output lead of said phase shift circuit;

a differentiator having an input lead and an output lead, said input lead of said differentiator being coupled to said output lead of said zero crossing detector;

a first threshold detector having an input lead and an output lead, said input lead of said threshold detector being coupled to said output lead of said amplifier, the amplitude of voltage from said threshold detector being determined by the amplitude of a signal from said amplifier;

a first threshold detector having first, second and third input leads and an output lead, said first and said third input leads of said flip-flop being connected to said output lead of said first threshold detector, said second input lead of said first flip-flop being coupled to said output lead of said differentiator, the voltage from said output lead of said flip-flop being determined by the amplitude of voltage applied to said first and said third input leads of said first flip-flop; and a summing circuit, said summing circuit being connected between said output lead of said first flip-flop and said second input lead of said amplifier, the voltage which said summing circuit provides to said second input lead of said amplifier being determined by the value of voltage from the output lead of said flip-flop.

4. A digital automatic gain control circuit as defined in claim 3 including:

an open collector inverter having an input lead and an output lead, said input lead of said inverter being connected to said output lead of said differentiator, said output lead of said inverter being connected to said second input lead of said first flip-flop.

5. A digital automatic gain control circuit as defined in claim 3, including:

a second threshold detector having an input lead and an output lead, said input lead of said second threshold detector being coupled to said output lead of said amplifier; and a second flip-flop having first, second and third input leads and an output lead, said first and said third input leads of said second flip-flop being connected to said output lead of said second threshold detector, said second input lead of said second flip-flop being coupled to said output lead of said differentiator, said output lead of said second flip-flop being coupled to said summing circuit.

6. A digital automatic gain control circuit as defined in claim 3 including:

an open collector inverter having an input lead and an output lead, said input lead of said inverter being connected to said output lead of said differentiator;

a second threshold detector having an input lead and an output lead, said input lead of said second threshold detector being coupled to said output lead of said amplifier; and a second flip-flop having first, second and third input leads and an output lead, said first and said third input leads of said second flip-flop being connected to said output lead of said second threshold detector, said second input lead of said first and said second flip-flops each being connected to said output lead of said inverter, said output lead of said second flip-flop being coupled to said summing circuit.

* * * * *